US005735152A

United States Patent [19]

Dietz et al.

[11] Patent Number: 5,735,152

[45] Date of Patent: Apr. 7, 1998

[54] LOCKING SYSTEM WITH MAGNETIC FIELD SHIELD

[75] Inventors: Günter Dietz, Heilsbronn; Matthias Kuhn, Eckental; Thomas Rupprecht, Moosbach, all of Germany

[73] Assignee: Temic Telfunken Microelectronic GmbH, Heilbronn, Germany

[21] Appl. No.: 770,906

[22] Filed: Dec. 20, 1996

[30] Foreign Application Priority Data

Dec. 22, 1995 [DE] Germany .......................... 195 48 268.9

[51] Int. Cl.[6] .............................. E05B 49/00; H05K 9/00

[52] U.S. Cl. ................................ 70/278; 70/276; 70/408; 174/35 R; 340/825.54

[58] Field of Search .............................. 70/276–278, 408, 70/413, 57.1; 343/841; 340/825.54; 174/35 R, 35 C

[56] References Cited

U.S. PATENT DOCUMENTS

| | | | |
|---|---|---|---|
| 3,686,421 | 8/1972 | Wunsche et al. . | |
| 4,439,699 | 3/1984 | Brende et al. . | |
| 4,453,269 | 6/1984 | Skar . | |
| 4,565,994 | 1/1986 | Mochida et al. | 70/1.5 X |
| 5,307,658 | 5/1994 | Kokubu et al. | 70/276 X |
| 5,551,267 | 9/1996 | Janssen et al. | 70/276 X |

FOREIGN PATENT DOCUMENTS

| | | |
|---|---|---|
| 0628684 | 12/1994 | European Pat. Off. . |
| 0640734 | 3/1995 | European Pat. Off. . |
| 3833886 | 8/1989 | Germany . |
| 4207161 | 9/1993 | Germany . |
| 4407692 | 9/1994 | Germany . |
| 4317119 | 11/1994 | Germany . |
| 19531178 | 2/1996 | Germany . |
| 92/20091 | 11/1992 | WIPO . |

*Primary Examiner*—Lloyd A. Gall

*Attorney, Agent, or Firm*—Spencer & Frank

[57] ABSTRACT

In a locking system comprising a lock unit and a key unit, each of which has an induction coil for transmitting power and data, the induction coil on the lock side is mounted by via a coil carrier on a lock body in the lock unit. Between the induction coil on the lock side and the lock body, there is a screening body which magnetically screens off the lock body from the induction coil on the lock side.

12 Claims, 1 Drawing Sheet

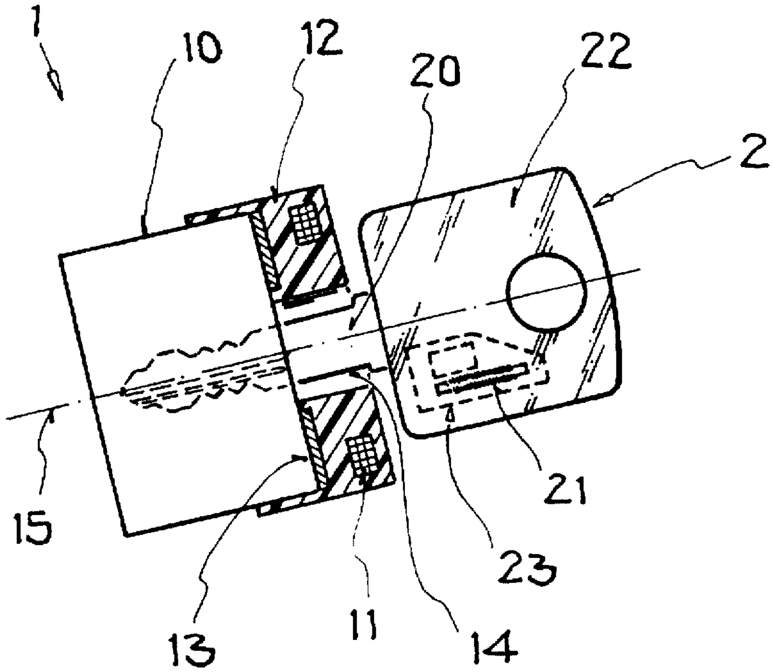
FIG.

LOCKING SYSTEM WITH MAGNETIC FIELD SHIELD

BACKGROUND OF THE INVENTION

The invention relates to a locking system having a lock unit and a key unit between which power and data can be transmitted, with the lock unit having a lock body on which a coil carrier with a lock side induction coil is provided for the transmission of power and date, and with a key side induction coil being provided in the key unit for the transmission of power and data.

A locking system of this kind is known from DE 42 07 161. The locking system described there has a key unit with an induction coil on the key side and a lock unit with an induction coil on the lock side. Data in the form of encoding information can be transmitted from one induction coil to the other, data transmission taking place to control the operation of a latching arrangement contained in the lock unit. The induction coil on the lock side is mounted on a lock body of the lock unit by means of a coil carrier and, when the key unit is inserted in the lock unit, is in direct proximity of the induction coil on the key side fitted in a key bit on the key unit.

In order to allow the induction coils to locate closely together, the area of the induction coil on the lock side directed towards the induction coil on the key side is open. The interference immunity of the data transmission can therefore be adversely affected to a considerable extent as a result of environmental factors such as the ingress of moisture to the induction coil on the lock side. Furthermore, the labor and the costs involved in the manufacture of the lock unit are high owing to the close proximity of the induction coils.

Also, the figure of merit of the induction coil on the lock side and therefore the interference immunity of the data transmission after mounting the induction coil on the lock side to the lock body is reduced by the material properties of the lock body. The cause of this reduction is a ring current induced in the lock body by a magnetic field arising at the time of data transmission. Since the magnetic field is a high-frequency alternating field, this ring current can only flow through a thin layer on the surface of the lock body because of what is known as the skin effect. The resistance of this layer, the thickness of which depends on the depth to which the magnetic field penetrates the lock body, depends on the conductivity and the magnetic permeability of the lock body. Since the thin layer and the induction coil on the lock side represent a transformer with the induction coil on the lock side as primary coil and the thin layer as short-circuited secondary coil, the resistance of this thin layer conducting the ring current is stepped up to the primary coil, i.e., to the induction coil on the lock side, and thus causes the resistance of the induction coil on the lock side to increase. Consequently, the figure of merit of the induction coil on the lock side is reduced by mounting the induction coil on the lock side onto the lock body.

SUMMARY OF THE INVENTION

The object of the invention is to provide a locking system that can be manufactured at low cost and with little labor and which allows interference-free data transmission that is hardly affected by environmental factors.

This object is solved in accordance with the invention by a locking system including a lock unit and a key unit between which power and data can be transmitted, wherein the lock unit has a lock body on which a coil carrier is located with a first induction coil provided for the transmission of power and data, and wherein a second induction coil provided in the key unit for the transmission of power and data, and wherein the lock unit has a screening body located between the first induction coil and the lock body to screen off magnetic fields. Advantageous variations and further developments are disclosed and discussed.

In accordance with the invention, the lock unit has a screening body that screens off magnetic fields and which is situated between the induction coil on the lock side and the lock body. The lock body is screened magnetically from the induction coils provided for the transmission of power and data by the screening body such that any magnetic field arising at the time of power and data transmission is unable to find penetrate the lock body. Consequently, the figure of merit of the induction coil on the lock side is not related to the material of the lock body. For the same reason, the inductance of the induction coil on the lock side is not related to the distance between lock body and induction coil on the lock side and consequently it is not related to any assembly tolerances there might be when mounting the coil carrier on the lock body. The power transmission and the interference immunity of data transmission, both of which depend on the figure of merit and inductance of the induction coils, are therefore improved by the screening body.

The screening body is made preferably of a material with good electrical conductivity and advantageously of a non-ferromagnetic material such as copper.

The locking system can be used wherever, together with a mechanical lock, the use of an additional electrical security system or identification system is required or advisable for checking the right of entry or access.

BRIEF DESCRIPTION OF THE DRAWINGS

The invention will now be described in further detail with reference to the drawing FIGURE which shows, as an example of application, a locking system for operating an ignition system and an electronic immobilizer in a motor vehicle.

DETAILED DESCRIPTION OF THE PREFERRED EMBODIMENT

The lock body 10 as shown in the FIGURE is a conventionally designed lock cylinder with a cylinder core that can be rotated in a housing and locked by means of mechanical tumblers. It is made of a ferromagnetic material, steel for instance, in order to provide a low-cost locking device that is difficult to damage.

The induction coil 11 on the lock side is fitted on the lock body 10 by means of a coil carrier 12 made of plastic. The coil carrier 12 has a keyhole 14 through which the key bit 20 of key unit 2 can be introduced into the lock body 10 in order to unlock the lock unit 1.

By introducing the key bit 20 into the lock body 10, the induction coil 21 on the key side of transponder 23 located in the grip 22 of key unit 2 is brought into the proximity of the induction coil 11 on the lock side. Inductive power and data transmission then takes place between the induction coils 11 and 21. Transponder 23 is thus supplied with power from the power transmission and hence activated to output data. Transponder 23 can also be activated to output data by data transmitted from the induction coil 11 on the lock side to the induction coil 21 on the key side. The key unit 2 is identified from the data transmitted from the induction coil 21 on the key side to the induction coil 11 on the lock side and, if there is a right of access for the vehicle, the vehicle immobilizer is deactivated.

The induction coil 11 on the lock side has no ferrite core as field conducting element and is wound around the keyhole 14 of the coil carrier 12, i.e., around the axis of rotation 15 of the lock body 10 and the key unit 2. Consequently, data transmission is possible irrespective of the position of the key unit 2 inserted in the lock body 10. This means that data transmission occurs even when the key unit 2 is turned in the lock body 10. The key unit 2 can therefore also be designed as a reversible key.

The screening body 13 is located between the induction coil 11 on the lock side and the lock body 10. It is made of copper, i.e., of a non-ferromagnetic material with high conductivity. Its purpose is to screen the lock body 10 from the induction coil 11 on the lock side and thus prevents the magnetic field created by the transmission of power and data from penetrating the lock body 10. The thickness of the screening body 13 is at least sufficient to prevent the magnetic field from passing it. Since the magnetic field in the present example is an alternating field with a frequency of 125 kHz, and since the depth of penetration of this magnetic field is approximately 0.2 mm in copper, the design thickness is therefore greater than this 0.2 mm. Furthermore, it has a wide area and covers as large a part as possible of the side of the lock body 10 facing the induction coil 11 on the lock side. In the present example, in order to keep the dimensions of the lock unit 1, and in particular the distance between the side of the coil carrier 12 facing the key unit 2 and the lock body 10, it is designed as a disk 13 with a thickness of approximately 0.5 mm. This disk 13 has an opening through which the key bit 20 of the key unit 2 can be introduced into the lock body 10.

Due to the magnetic field created during the transmission of power and data, a ring current is induced which, however, on account of the skin effect, flows through only a thin layer on the side of the screening body 13 facing the induction coil 11 on the lock side. If there were no screening body 13, this ring current would flow through a thin layer on the surface of the lock body 10. This ring current produces a reduction in the figure of merit of the induction coil 11 on the lock side, and this reduction increases with the magnitude of the resistance of the layer conducting the ring current. Since, because of the materials used, the magnetic field can penetrate to a greater depth in the screening body 13 than in the lock body 10, and since furthermore the electrical conductivity of the screening body 13 is greater than that of the lock body 10, the layer of the screening body 13 conducting the ring current has a lower resistance than the corresponding layer of the lock body 10 through which the ring current would flow in the absence of screening body 13. The figure of merit of the induction coil on the lock side is therefore reduced to a considerably lesser extent by the ring current flowing through the screening body 13 than by the ring current that would flow in the absence of the screening body 13 in the lock body 10. This means that with the screening body 13 the figure of merit of the induction coil 11 on the lock side is reduced, but this reduction is considerably less than the reduction obtained by assembling coil carrier 12 without screening body 13 on lock body 10.

The induction coil 11 on the lock side and the screening body 13 are securely joined to one another at the time of manufacture of the coil carrier 12, advantageously in one working step, for instance by injection molding. A definable distance, of approximately 1 mm for example, between the induction coil 11 on the lock side and the screening body 13 can be obtained with high accuracy. Since the inductance of the induction coil 11 on the lock side varies in accordance with this distance, the inductances of induction coils joined in this way with screening bodies vary only slightly from one another.

By screening, one also obtains a reduction of the influence of the lock body 10 on the inductance of the induction coil 11 on the lock side so that, when the coil carrier 12 is assembled to the lock body 10, no tight specifications are given with respect to maintaining a particular distance between the lock body 10 and the induction coil 11 on the lock side.

Vehicles with conventional ignition locks can thus be retrofitted with little effort and at low cost with an induction coil on the lock side for operating an immobilizer.

What is claimed is:

1. A locking system having a lock unit and with a key unit between which power and data can be transmitted, wherein the lock unit has a lock body on which a coil carrier with a first induction coil, provided for the transmission of power and data, is located, wherein a second induction coil is provided in the key unit for the transmission of power and data, and wherein the lock unit has a screening body located between the first induction coil and the lock body to screen off magnetic fields, with the screening body being made of a material with good electrical conductivity.

2. Locking system in accordance with claim 1, wherein the screening body is made of copper.

3. Locking system in accordance with claim 2, wherein the screening body is joined firmly with the coil carrier.

4. Locking system in accordance with claim 1, wherein the screening body is in direct contact with the lock body which is formed of metal.

5. Locking system in accordance with claim 1, wherein the screening body is an annular disk with a continuous surface.

6. Locking system in accordance with claim 5, wherein the annular disk has a thickness greater than the penetration depth of the magnetic field into the disk.

7. A key-operated locking cylinder device including:

a lock cylinder device body formed of ferromagnetic material and having a first end into which a key can be inserted along an axis of rotation of the lock cylinder device body;

a coil carrier mounted on said first end of said lock body and about said axis of rotation;

an induction coil, for transmission of power and data, mounted on said coil carrier and about said axis of rotation; and, a screening body mounted on said lock body and located between said induction coil and said first end of said lock body to screen off magnetic fields produced by said induction coil, with said screening body being formed of a high conductivity non-ferromagnetic material and having an opening along said axis of rotation.

8. A locking device in accordance with claim 7, wherein said screening body has a continuous surface about said opening.

9. A locking device in accordance with claim 8, wherein said screening body has a thickness greater than the penetration depth of the magnetic field into the screening body.

10. A locking device in accordance with claim 8, wherein said material of said screening body is copper.

11. A locking device in accordance with claim 8, wherein said screening body is an annular disk.

12. A locking device in accordance with claim 11, wherein the disk is in direct contact with said first end of said lock cylinder device body.

* * * * *